US008370095B2

(12) United States Patent
Ishikawa et al.

(10) Patent No.: US 8,370,095 B2
(45) Date of Patent: Feb. 5, 2013

(54) METHOD FOR CLOCKING CUMULATIVE OPERATING TIME FOR A CARGO-HANDLING VEHICLE, AND THE CARGO-HANDLING VEHICLE BY USE OF THE METHOD

(75) Inventors: Naoki Ishikawa, Sagamihara (JP); Tsutomu Kurihara, Sagamihara (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 212 days.

(21) Appl. No.: 12/746,057

(22) PCT Filed: Jun. 23, 2009

(86) PCT No.: PCT/JP2009/061802
§ 371 (c)(1),
(2), (4) Date: Jun. 18, 2010

(87) PCT Pub. No.: WO2010/001839
PCT Pub. Date: Jan. 7, 2010

(65) Prior Publication Data

US 2011/0091005 A1 Apr. 21, 2011

(30) Foreign Application Priority Data

Jul. 3, 2008 (JP) ................................ 2008-175097

(51) Int. Cl.
*G01R 29/033* (2006.01)

(52) U.S. Cl. ........................................................ 702/79

(58) Field of Classification Search .................... 702/79, 702/182–185
See application file for complete search history.

(56) References Cited

U.S. PATENT DOCUMENTS

2004/0153362 A1 * 8/2004 Bauer et al. ..................... 705/10

FOREIGN PATENT DOCUMENTS

| | | | |
|---|---|---|---|
| JP | 59-3146 | A | 1/1984 |
| JP | 6-333166 | A | 12/1994 |
| JP | 2007-3468 | A | 1/2007 |
| JP | 2008-40568 | A | 2/2008 |
| JP | 2008-139935 | A | 6/2008 |

* cited by examiner

*Primary Examiner* — Edward Raymond
(74) *Attorney, Agent, or Firm* — Birch, Stewart, Kolasch & Birch, LLP

(57) ABSTRACT

The use time till a display unit including an hour meter (a time measuring device) is replaced can be continued even if the time measuring device fails, and false alteration after shipping can be prevented while infallibly resetting the hour meter to zero when the vehicle equipped with the hour meter is shipped from the factory. The cargo handling vehicle includes a first storage device for accumulatively storing the vehicle use time measured by a first time measuring device provided in a display unit of the vehicle and a second storage device for accumulatively storing the vehicle use time measured by a second time measuring device provided in a control device. The control device allows the first and second storage devices to communicate the accumulated use times stored therein when the electric power of the vehicle is turned on. The control device compares the accumulated use times and writes the longer accumulated use time in the storage device storing the shorter one.

19 Claims, 3 Drawing Sheets

METHOD FOR CLOCKING CUMULATIVE OPERATING TIME FOR A CARGO-HANDLING VEHICLE, AND THE CARGO-HANDLING VEHICLE BY USE OF THE METHOD

BACKGROUND OF THE INVENTION

Field of the Invention

The present invention relates to a method for clocking cumulative operating time for a cargo-handling vehicle, and the cargo-handling vehicle by use of the method.

The present invention particularly relates to the cargo-handling vehicle in which the total cumulative operating time thereof is always clocked on the side of the display unit (display and counter unit) of the vehicle after the factory shipment of the vehicle, thereby the correct total cumulative operating time can be always conserved, even when the display unit becomes out of order and is replaced by new unit.

A general passenger automobile is provided with an odometer so that it can be known how far the automobile has traveled after the factory shipment; in a case where the odometer becomes out of order and is replaced by new one, it is required that the cumulative travel distance at the time point of the replacement be described in the safety check certificate of the automobile. On the other hand, in a case of a forklift as a cargo-handling vehicle, the total operating time after the factory shipment thereof is required to be integrated in an hour meter (a clock or a time counter). instead of an odometer, In general, the hour meter is often equipped so that the meter is combined in a speed display device or the like and the cumulative operating time after the factory shipment cannot be revised. In a case where the hour meter becomes out of order and is replaced by new one, the memory that stores the cumulative operating time is reset to zero and it becomes difficult to know the correct cumulative operating time. Especially in a case where an alarm display device or the like is combined to the display unit, namely, in a case where the display device and the alarm display forms an assembly part, the whole assembly part is replaced by new one, even though the disorder is limited to an annunciator lump for the alarm display; thus, the reset problem as described above occurs.

In addition, the hour meter generally integrates the cumulative operating time under a condition that the power source of the cargo-handling vehicle is placed under an ON-state (condition). In order to cancel the integrated time during the adjusting operation of the a cargo-handling vehicle before the factory shipment, the cumulative operating time before the factory shipment is reset to zero and the vehicle is delivered. There arises an apprehension that the cumulative operating time is made an alteration if a user can perform the above-described 0-reset operation after factory shipment; therefore, the vehicle is delivered so that the 0-reset operation as to the cumulative operating time cannot be performed after factory shipment.

In relation to the hour meter as described above, the patent reference 1 (JP2008-040568) discloses a vehicle control device by which the data regarding to the cumulative operating time cannot be altered after the factory shipment of the vehicle; thereby, the cumulative operating time is stored in a nonvolatile memory; the data (values) stored in the clocking device are made changeable by means of a tool on an external side of the clocking device (or the vehicle); the data (values) in the hour meter can be changed only when the cargo-handling vehicle is a new-vehicle; and, whether or not the vehicle is a new-vehicle is judged according to whether the cumulative operating time stored in the hour meter is zero or near zero.

According to the disclosure of the patent reference 1, the falsification of the data records after factory shipment may be prevented; however, the patent reference gives neither disclosure nor suggestion regarding how to cope with the situation in which the record of the cumulative operating time is reset to zero and becomes missing, in a case where the display device comprising the hour meter becomes out of order and has to be replaced by new one.

In view of the above-described difficulties to deal with, the subject of the present invention is to provide a method for clocking cumulative operating time for a cargo-handling vehicle and the cargo-handling vehicle by use of the method, the vehicle comprising a display or control device having an hour meter (a clock or a time counter), wherein the cumulative operating time is conserved even in a case where the display or control device having the hour meter becomes out of order and is replaced by new one; in addition, the data stored in the hour meter are prevented from being falsified after the vehicle is delivered from the factory, whereas the data can be reset to zero when the vehicle is delivered from the factory. It is noted that resetting the data to zero is often called "0-rest" hereafter in this specification.

REFERENCES

Patent Reference 1: JP2008-040568

DISCLOSURE OF THE INVENTION

In order to reach the goal of the above subject, the present invention discloses a method for clocking cumulative operating time for a cargo-handling vehicle provided with a plurality of functional units, the functional units comprising a first functional unit and a second functional unit; whereby, at least the first functional unit having a first clocking device and the second functional unit having a second clocking device clock the cumulative operating time;

the data of the clocked cumulative operating time is stored in a first memory (device) provided in the first functional unit and a second memory (device) provided in the second functional unit;

the cumulative operating time stored in the first memory (device) is transmitted toward the second memory (device) through a communication port in the first functional unit and a communication port in the second functional unit periodically, whereas the cumulative operating time stored in the second memory (device) is transmitted toward the first memory (device) through the communication port in the first functional unit and a communication port in the second functional unit, periodically;

the difference between the cumulative time stored in the first functional unit and the cumulative time stored in the second functional unit is computed in each of the first and second functional units, so that it is grasped whether or not the cumulative operating time stored in one side functional unit is greater than or equal to the cumulative operating time stored in the other side functional unit;

the cumulative operating time stored in one side functional unit is renewed with the cumulative operating time stored in the other side functional unit in a case where the cumulative operating time stored in one side functional unit is smaller than the cumulative operating time stored in the other side functional unit, whereas the cumulative operating time stored in one side functional unit is conserved on an as-is basis in a case where the cumulative operating time stored in one side functional unit is greater than or equal to the cumulative operating time stored in the ether side functional unit.

Further, the present invention discloses a cargo-handling vehicle provided with a plurality of functional units including a first functional unit and a second functional unit, the vehicle having at leas one clocking device and at least one memory device for storing the cumulative operation time of the vehicle clocked by the clocking device, whereby the functional units includes at least the first functional unit having a first clocking device and a first memory device;

the functional units includes at least the second functional unit having a second clocking device and a second memory device;

each of the first and second clocking devices clocks the cumulative operating time independently each other and stores the clocked time in the corresponding memory device, while the power source of the vehicle is put under ON-state;

the cumulative operating time stored in the first memory (device) is transmitted toward the second memory (device) through a communication port in the first functional unit and a communication port in the second functional unit, whereas the cumulative operating time stored in the second memory (device) is transmitted toward the first memory (device) through the communication port in the first functional unit and a communication port in the second functional unit;

the cumulative time stored in the first functional unit and the cumulative time stored in the second functional unit are compared with each other in each of the first and second functional units, so that it is grasped whether or not the cumulative operating time stored in one side functional unit is greater than or equal to the cumulative operating time stored in the other side functional unit;

the cumulative operating time stored in one side functional unit is renewed with the cumulative operating time stored in the other side functional unit in a case where the cumulative operating time stored in one side functional unit is smaller than the cumulative operating time stored in the other side functional unit, whereas the cumulative operating time stored in one side functional unit is conserved on an as-is basis in a case where the cumulative operating time stored in one side functional unit is greater than or equal to the cumulative operating time stored in the other side functional unit.

In the above-disclosed method, the transmission regarding the cumulative operating time between the first and second functional units is preferably performed through the communication ports, when (just after) the power source of the vehicle is put under an ON-state; and the difference computation and the data transfer as well as the data storage based on the difference comparison are preferably performed, when (just after) the power source of the vehicle is put under an ON-state.

Further, in the above-disclosed method, the transmission regarding the cumulative operating time between the functional units is preferably performed through the communication ports, at the time points of predetermined time intervals; and, the difference computation and the data transfer as well as the data storage based on the difference comparison are preferably performed, at the time points of predetermined time intervals.

Therefore, in response to the preferable method embodiments, in the above-disclosed cargo-handling vehicle, the transmission regarding the cumulative operating time between the first and second functional units is preferably performed through the communication ports, when (just after) the power source of the vehicle is put under an ON-state; and, the data comparison and the data transfer as well as the data storage based on the comparison are preferably performed, when (just after) the power source of the vehicle is put under an ON-state.

Further, in the above-disclosed cargo-handling vehicle, the transmission regarding the cumulative operating time between the functional units is preferably performed through the communication ports, at regular (predetermined) time intervals; and, the data comparison and the data transfer as well as the data storage based on the comparison are preferably performed, at the time points of predetermined time intervals.

In the present invention as described above, each of the first and second functional units is provided with a clocking device for clocking the cumulative operating time of the cargo handling vehicle as well as a memory device for storing the cumulative operating time; further, each of the first and second functional units is provided with a communication port (means) for communicating the data regarding the cumulative operating time. Thus, the functional units transfer the data regarding the cumulative operating time to each other; the data (the datum) in one unit is compared with the data (the datum) sent from the other unit; each functional unit memorizes the data regarding the cumulative operating time in the functional unit; thereby, the data transmission, data comparison and the data memorization are performed, at a time point just after the power source of the vehicle is put under an ON-state, or at the time points of predetermined time intervals during the operation of the vehicle. Thus, if the cumulative operating time in a functional unit is smaller than the cumulative operating time in the other side functional unit, the latter is imported to the former; accordingly, even when a functional unit provided with the hour meter becomes out of order and has to be replaced by new one, the proper cumulative operating time of the vehicle can be surely succeeded to a functional unit from a functional unit. Thus, there arises no apprehension that the data regarding the proper cumulative operating time is lost; the display unit can always indicate the proper cumulative operating time.

Thus, according to the present invention, even when one of the functional units such as the display unit or the control unit becomes out of order and replaced by an alternative unit, the cumulative operating time in a functional unit other than the disordered unit is imported to the cumulative operating time in the alternative unit; accordingly, the correct (proper or authentic) cumulative operating time is succeeded to a functional unit from a functional unit, for instance, even when either of functional units such as the display unit and the control unit becomes out of order. The falsification as to the cumulative operating time hinders the correct estimation as to the present worth of the cargo-handling vehicle. By continuing to memorize the data regarding the greater cumulative operating time out of the data stored in the display unit and the control unit, the falsification can be prevented.

In the above-disclosed method, the memory device in each functional unit preferably comprises a pair of a volatile memory and a non-volatile memory; and, the cumulative operating time clocked by a clocking device in each functional unit is preferably written on the volatile memory; and, the data stored in the volatile memory is preferably written on the corresponding non-volatile memory, at the time points of predetermined time intervals, or at the time point when the power source of the vehicle is put under an OFF-state.

Therefore, in response to the above preferable method embodiment, in the above-disclosed cargo-handling vehicle, the memory device in each functional unit preferably comprises a pair of a volatile memory and a non-volatile memory; and, the cumulative operating time clocked by the clocking device in each functional unit is preferably written on the volatile memory; and, the data written on the volatile memory is preferably written on the corresponding non-volatile memory, at the time points of predetermined time intervals, or at the time point when the power source of the vehicle is put under an OFF-state.

Accordingly, even in an event of power shutdown due to a sudden failure, the data regarding proper cumulative operating time is conserved, and the management as to the proper cumulative operating time can be duly performed.

Further, in relation to the above-disclosed method, the vehicle further comprising a (communicating) means for communicating with an external service tool, whereby the data regarding the cumulative operating time in the volatile memory is preferably reset to zero according to a 0-reset order from the external service tool; thereby, a 0-reset prohibition flag is preferably set on the memory devices so that the 0-reset is not performed in each of the functional units after the external service tool is detached from the vehicle;

the data in the non-volatile memory is preferably conserved on an as-is basis during the power source is put under an OFF-state or when the 0-reset operation according to the order from the external service tool is completed.

Therefore, in response to the above preferable method embodiment, in the above-disclosed cargo-handling vehicle, the control unit is preferably provided with a function to perform a 0-reset regarding the cumulative operating time of the clocking device and the memory device provided in each of the first and second functional units the control unit preferably resets the data regarding the cumulative operating time in the volatile memory and the non-volatile memory in each of the first and second functional units to zero according to a 0-reset order signal from the external service tool; thereby, the control unit preferably sets a 0-reset prohibition flag on the memory devices so that the 0-reset is not performed in each of the functional units after the external service tool is detached from the vehicle.

Accordingly, for instance, even in a case where either of the functional units such as the display unit and the control unit comprises a clocking device and a memory device, the 0-reset operation can be surely performed over all the functional units at the factory shipment of the vehicle; further, since the 0-reset operation for the control unit and the display unit cannot be again executed when the vehicle is placed on the side of the users after the factory shipment of the vehicle, the falsification of the hour meter (the clocking device) can be prevented thanks to the 0-reset prohibition flag established in the control unit and the display unit.

As explained thus far, in the cargo-handling vehicle according to the present invention, since the data regarding the cumulative operating time is conserved from a functional unit to a functional unit even when a functional unit provided with an hour meter becomes out of order and replaced by an alternative unit, there arises no apprehension that the data regarding the proper cumulative operating time is lost. Further, although each functional unit such as the display unit or the control unit comprises a clocking device and a memory device, the 0-reset operation can be surely performed over all the functional units at the factory shipment of the vehicle; moreover, the falsification of the data regarding the cumulative operating time as to the vehicle can be prevented after the vehicle is placed on the side of the users. Therefore, a method for clocking cumulative operating time for a cargo-handling vehicle and the cargo-handling vehicle by use of the method can be provided.

BRIEF DESCRIPTION OF THE DRAWINGS

The present invention will now be described in greater detail with reference to the preferred embodiments of the invention and the accompanying drawings, wherein.

DETAILED DESCRIPTION OF THE PREFERRED EMBODIMENTS

Hereafter, the present invention will be described in detail with reference to the embodiments shown in the figures. However, the dimensions, materials, shape, the relative placement and so on of a component described in these embodiments shall not be construed as limiting the scope of the invention thereto, unless especially specific mention is made.

First Embodiment

Figure 1:
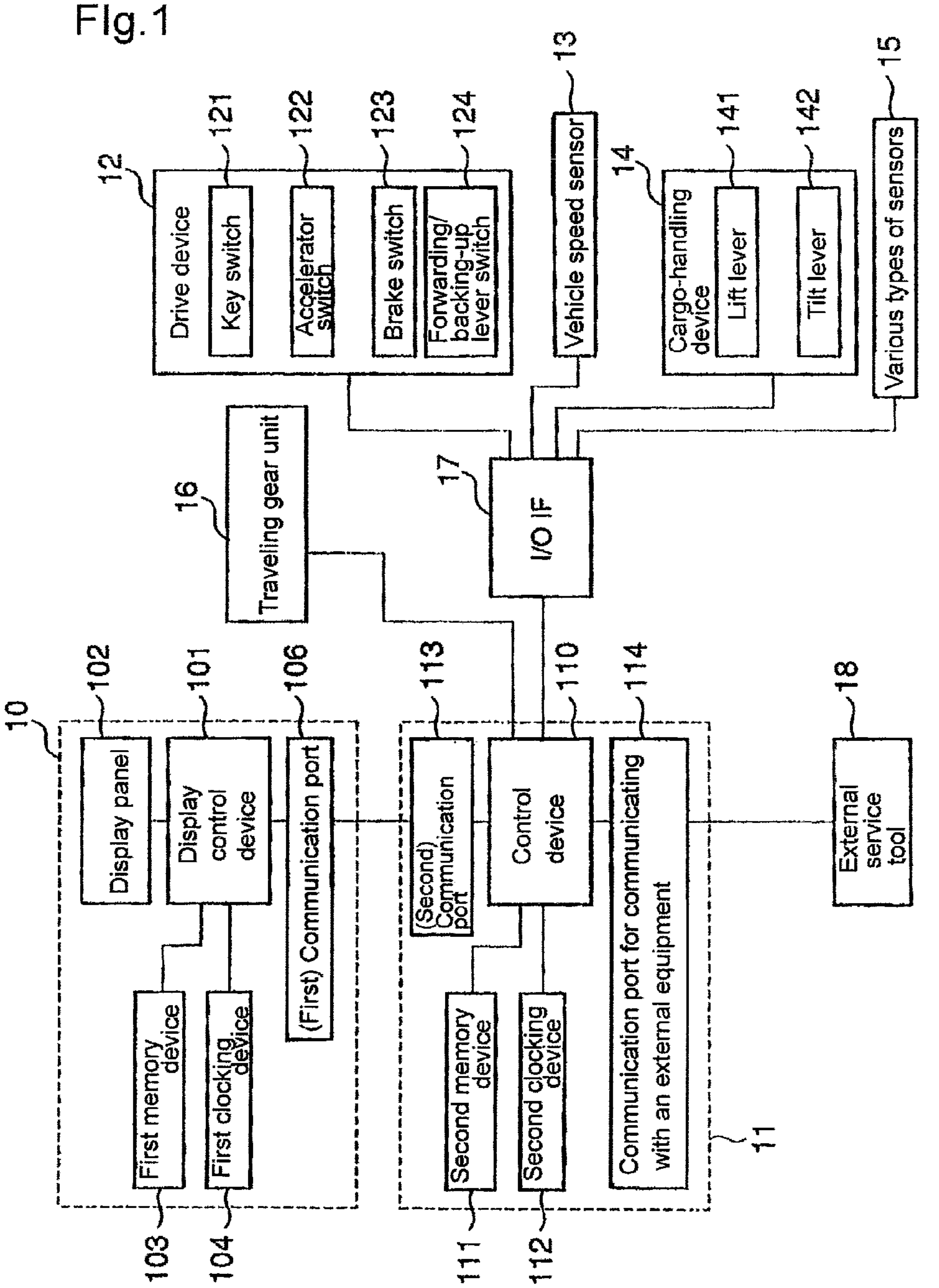
FIG. 1 shows a block diagram for the configuration as to the cargo-handling vehicle that comprises a display device (unit), according to the present invention.
Figure 2:
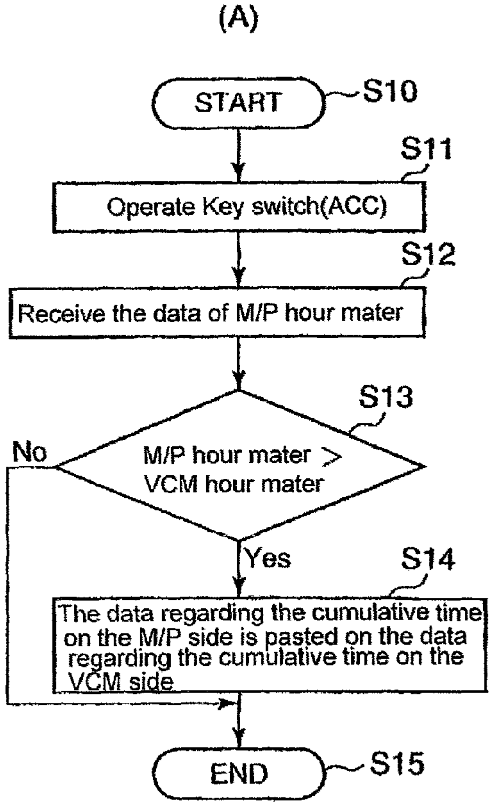
FIGS. 2(A) and 2(B) respectively show a flow diagram as to the method for clocking the operating time of the cargo-handling vehicle, according to the present invention.
Figure 3:
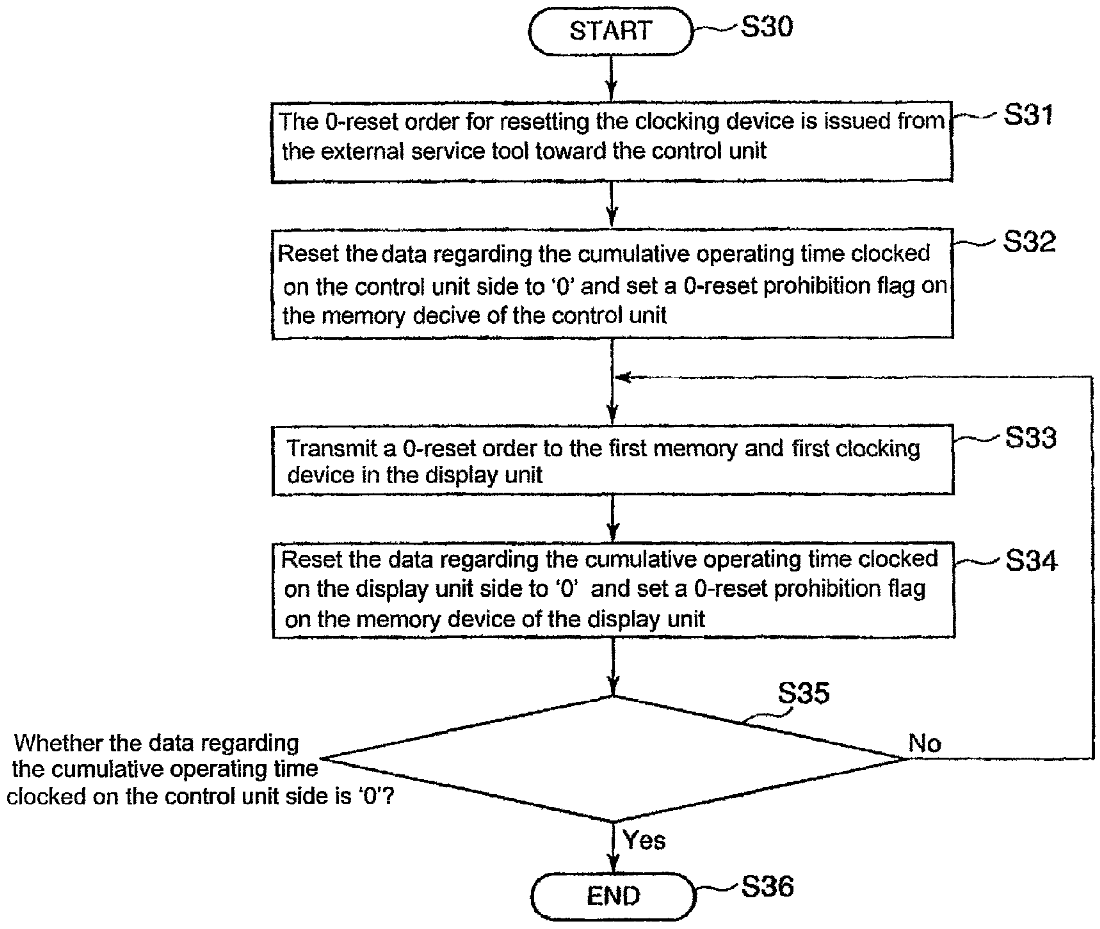
FIG. 3 shows a flow diagram as to the 0-reset operation of the hour meter in the display device (unit) of the cargo-handling vehicle according to the present invention, the 0-reset operation being performed when the vehicle is delivered from the factory.

FIG. 1 shows a block diagram for the configuration as to the cargo-handling vehicle that comprises a display device (unit), according to the present invention; FIGS. 2(A) and 2(B) respectively show a flow diagram as to a method for clocking the cumulative operating time of the cargo-handling vehicle, according to the present invention; FIG. 3 shows a flow diagram as to the 0-reset operation of the hour meter (a clock or a time counter) when the vehicle is delivered from the factory.

In FIG. 1, the numeral 10 denotes a display unit including a CPU as well as memory (a memory device); the display unit 10 receives signals from a control unit 11 that controls the whole cargo-handling vehicle as described later; the display unit displays various kinds of data (as to the signals) on a display panel 102. The data include a plurality of display items such as the speed of the vehicle, the engine speed, the tilt angle of the fork in a case where the cargo-handling vehicle is a forklift, the weight of the goods to be carried, the amount of the remaining fuel, the engine cooling water temperature, other error indications or caution labels (alarm displays) and so on. Further, the display unit 10 includes a display control device 101 for performing the data processing as to data display and data communication, a first clocking device 104 for clocking the cumulative operating time of the vehicle, a first memory (device) 103 for storing the cumulative operating time which the first clocking device 104 clocked, a (first) communication port 106 for communicating with the control unit 11 by use of a communication control protocol named CAN (Controller Area Network) or a communication control protocol named Flex Ray.

The control unit 11 includes a CPU as well as a memory (a memory device), the unit 11 comprising a control device 110 for controlling the whole cargo-handling vehicle, a second clocking device 112 for clocking the cumulative operating time of the vehicle, a second memory (device) 111 for storing the cumulative operating time which the second clocking device 112 clocked, a (second) communication port 113 for communicating with the display unit 10 by use of a communication control protocol named CAN or Flex Ray, as is the case with the (first) communication port 106, and a (communicating) means 114 for communicating with an external equipment such as an external service tool 18 being used by a manufacturer side engineer, namely, a service engineer in performing maintenance work.

In addition, each of the first memory (device) 103 and the second memory (device) 111 is configured with volatile memory (RAM: Random Access Memory) and non-volatile memory (ROM: Read Only Memory); the data as to the cumulative operating time clocked by the first clocking device 104 and the second clocking device 112 are at first stored in (written to) the volatile memory of each memory (device); in the next place, the data are written to the non-volatile memory corresponding to the volatile memory after a predetermined time span has passed or when the power source for the cargo-handling vehicle is shutdown, so that the data are surely conserved. Further, in the non-volatile memory of the first memory (device) 103 or the second memory (device) 111, an internal flag is set so as to prohibit a second 0-rest after factory shipment of the vehicle from the factory; the prohibition flags are set at the time of the vehicle shipment when the data in the first memory (device) 103, the first clocking device 104, the second memory (device) 111, and the second clocking device 112 are reset to zero.

The numeral 12 denotes a drive device (a drive operation panel) comprising a key switch 121 for placing the power source of the vehicle under an ON-state or an OFF-state, an accelerator switch 122 for transmitting a signal (an accelerating signal) when the accelerator is stepped on, a brake switch 123 for transmitting a signal (a braking signal) when the brake pedal is stepped on, and a forwarding/backing-up lever switch 124 for transmitting a signal (a forwarding/backing-up signal) in shifting the forwarding/backing-up lever.

The numeral 13 denotes a vehicle speed sensor for detecting the travel speed of the cargo-handling vehicle; the numeral 14 denotes a cargo-handling device of a forklift, the cargo-handling device comprising a lift lever 141 for transmitting an order signal for lifting a cargo, and a tilt lever 142 for transmitting an order signal for inclining the fork forward or backward. The numeral 15 denotes a set of the sensors including a sensor for detecting the amount of the remaining fuel, a sensor for detecting the engine cooling water temperature and so on.

The numeral 16 denotes a traveling gear unit for driving the vehicle, the gear (unit) comprising an engine, a transmission, a brake and so on; the numeral 17 denotes an I/O (Input/Output) interface for transmitting the signals to the control unit 11 from the drive operation panel 12, the vehicle speed sensor 13, the cargo-handling device 14, and the set of the sensors 15; the numeral 18 denotes the external service tool for communicating with the control unit 11, the external service tool 18 being used by a manufacturer side engineer, namely, a service engineer who performs maintenance work. Hereafter, the explanation will be given about the examples whereby the present invention is applied to a cargo-handling vehicle such as a forklift; as a mater of course, it goes without saying that the present invention is applicable to any general cargo-handling vehicle other than a forklift.

In the cargo-handling vehicle as described thus far, the display panel 102 that configures the display unit 10 turns on a light when the key switch 121 is brought to an ON state (placed under a power-on condition); the data (signal) as to the cumulative operating time stored in the first memory (device) 103 is transferred toward the second memory (device) 111 in the control unit 11 via the (first) communication port 106 and the (second) communication port 113, while the data (signal) as to the cumulative operating time stored in the second memory (device) 111 is transferred toward the first memory (device) 103 in the display unit 10 via the (second) communication port 113 and the (first) communication port 106; in the display unit 10, the data value that has been stored therein is compared with the data value transferred from the control unit 11; and, if the two values are different, then the greater value is stored in the first memory (device); on the other hand, in the control unit 11, the data value that has been stored therein is compared with the data value transferred from the display unit 10; and, if the two values are different, then the greater value is stored in the second memory (device). Subsequently, the first clocking device 104 and the second clocking device 112 continue to clock the cumulative operating time independently of each other; the clocked cumulative operating time is reflected on each memory device while the key switch is placed an ON-state. Then, the data clocked by the first clocking device 104 is displayed on the display panel 102. Further, the display panel 102 displays the data transferred from the various sensors 15 via the I/O (Input/Output) interface 17, the control device 110, the (second) communication port 113, and the (first) communication port 106, whereby the transferred data are the fuel remaining amount, the engine cooling water temperature, and the other state variables regarding the cargo handling vehicle.

In transporting a cargo, the tilt lever 142 of the cargo-handling vehicle 14 is pulled and the fork is lifted up to a level of 15 to 20 cm from a road surface; and, the accelerator is stepped on; thus, the traveling gear unit 16 is driven through the I/O (Input/Output) interface 17 as well as the control device 110. In this way, the cargo-handling vehicle travels to a place where a cargo exists, so as to face the cargo; thereby, the vehicle once stops by means of the brake 123, in front of the cargo at a distance of approximately 20 to 30 cm from the cargo; then, the fork is put under (or returned back to) a level condition, by operating the tilt lever 142; further, the height of the level plane is adjusted to a height of the pallet entry as to the cargo.

Under the just described condition, the cargo-handling vehicle steps forward by canceling the brake 123 and placing the forwarding/backing-up lever switch 124 at the forwarding position, under a condition that the pallet reaches the base of the fork; thus, the vehicle steps forward and stops, and the brake 123 is locked. In the next place, the cargo is lifted up by approximately 10 cm, by operating the lift lever 141; further, the fork is inclined over backward by pulling the tilt lever 142 so that the cargo loading condition can be stabilized; further, the cargo-handling vehicle steps backward to a place where the cargo can be safely unloaded, by canceling the brake 123 and placing the forwarding/backing-up lever switch 124 at a backing position.

When the vehicle steps back by 20 to 30 cm, the vehicle stops; the brake switch 123 is activated and the lift lever 141 is operated; subsequently, the lowermost bottom of the fork is lowered to a level of 15 to 20 cm from a road surface; then, the brake switch 123 is cancelled; the forwarding/backing-up lever switch 124 is placed at the backing position; and the vehicle is moved backward to a place where the vehicle can safely alter the traveling direction; and the vehicle goes to a next destination, for example, to a place where a truck exists.

As described above, the movement of the forklift is explained in relation to the block diagram of FIG. 1; in the next place, a method for clocking the cumulative operating time as to the cargo-handling vehicle configured as described above according to the present is now explained by use of the flow diagrams of FIGS. 2(A) and 2(B) that respectively give an explanation as to the method. Incidentally, FIG. 2(A) shows the flow diagram as to the control unit 11 (hereafter, occasionally abbreviated as VCM11), while FIG. 2(B) shows the flow diagram as to the display unit 10 (hereafter, occasionally abbreviated as M/P10). Between VCM11 and M/P10, the data including the operating time clocked by the first clocking device and the second clocking device are transmitted and received each other periodically.

In the cargo handling vehicle as described thus far, two clocking devices for clocking the operating time is provided: one in the control unit 11, the other in the display unit 10; two memories for storing the cumulative operating time is provided; one in the control unit 11, the other in the display unit 10. The control unit 11 and the display unit 10 mutually exchange the data information including the cumulative operating time through the communication ports 106 and 113, periodically.

In the control unit 11 (VCM) in reference to FIG. 2(A), when the key switch 121 for turning the power on or off as to the cargo handling vehicle is brought to an ON state (placed under a power-on condition), the step S11 is followed by the step 12 where the control device 11 (VCM) receives the data regarding the cumulative operating time clocked by the display unit (M/P) 10; then, the step S12 is followed by the step S13 where the cumulative operating time clocked by the control unit 11 (VCM) is compared with cumulative operating time clocked by the display unit (M/P) 10; in the step S13, it is judged whether or not the cumulative time on the M/P side is greater than that on the VCM side; if the judgment is affirmative, namely, if the cumulative time on the M/P side is greater than that on the VCM side, then the step S13 is followed by the step S14 where the data regarding the cumulative time on the M/P side is pasted (overwritten) on the data regarding the cumulative time on the VCM side (on the second memory (device) 111). Further, if the judgment in the step S13 is negative, namely, if the cumulative time on the M/P side is smaller than or equal to that on the VCM side, then the step S13 is followed by the step S15 where a series of processes finishes.

On the other hand, in the display unit (M/P) 10 in reference to FIG. 2(B), when the key switch 121 for turning the power on or off as to the cargo handling vehicle is brought to an ON state (placed under a power-on condition), the step S21 is followed by the step 22 where the display unit (M/P) 10 receives the data regarding the cumulative operating time clocked by the control device 11 (VCM); then, the step S22 is followed by the step S23 where the cumulative operating time clocked by the display unit (M/P) 10 is compared with cumulative operating time clocked by the control unit 11 (VCM); in the step S23, it is judged whether or not the cumulative time on the VCM side is greater than that on the M/P side; if the judgment is affirmative, namely, if the cumulative time on the VCM side is greater than that on the M/P side, then the step S23 is followed by the step S24 where the data regarding the cumulative time on the VCM side is pasted (overwritten) on the data regarding the cumulative time on the M/P side (on the first memory (device) 103). Further, if the judgment in the step S23 is negative, namely, if the cumulative time on the VCM side is smaller than or equal to that on the M/P side, then the step S23 is followed by the step S25 where a series of processes finishes.

In the manner as described above, even if the whole display unit 10 is replaced by new one only because of a breakdown or a light failure, the data that has been stored regarding the cumulative operating time is conserved in the second memory (device) 111 of the control unit 11; thus, there is no apprehension as to a data loss, and the display unit can always display the correct cumulative time. Thus far, the explanation has been given on the premise that the display unit 10 is renewed; the explanation may be given on the premise that the control unit 11 is renewed. In a case where the control unit is renewed for any reason, the data regarding the cumulative operating time in the first memory (device) 103 of the display unit 10 is transferred to (overwritten to) the second memory (device) 111 of the display unit 10 as per the procedure as described above; thus, even a failure happens whether on the display unit 10 or on the control unit 11, the correct cumulative operating time can be always conserved.

Thus far, the explanation has been given about how the data regarding the cumulative operating time is conserved in a case where the display unit 10 or the control unit 11 is renewed in the cargo-handling vehicle. In the next place, the explanation will be given about a handling procedure regarding the 0-reset operation in connection to FIG. 3. As described thus far, the cumulative operating time increases during the adjustment work (before factory shipment) in the factory; thus, it becomes necessary to reset the data regarding the cumulative operating time when the vehicle is delivered from the factory. Moreover, it is required to provide a measure to prohibit the falsification of the data regarding the cumulative operating time (the contents of the hour meter or the clocking device) after the factory shipment of the vehicle. In a case where there are two clocking devices (namely, the first clocking device 104 and the second clocking device 112) as well as two memory devices (namely, the first memory (device) 103 and the second memory (device) 111), it is necessary to reset the data over all the clocking devices and the memories accurately to zero.

In a case like this, it is required that all the data regarding the cumulative operating time over the clocking devices and the memory devices be accurately reset to zero; if the data of non zero value regarding the cumulative operating time is left in any one of the clocking devices and the memory devices at the factory shipment of the vehicle, then the non-zero data hinders an accurate data succession from a functional unit to a functional unit in the vehicle, as there arises a problem that the relatively greater data (non zero data) is overwritten on the memory data in which the zero value has been already placed, for instance, according to the rule of the flow diagram of FIGS. 2(A) and 2(B), after the vehicle is handed over to the owner.

In order to prevent the above-described problem, by using the flow diagram in FIG. 3 that shows the procedure flow regarding the 0-reset operation for the cargo handling vehicle according to the present invention, the explanation is now be given about the 0-reset operation regarding the hour meters (the clocking devices). In a cargo-handling vehicle according to the present invention, the 0-reset order is issued by the external service tool 18 shown in FIG. 1, or by a tool similar to the external service tool 18, through the (communicating) means 114 at the factory shipment of the vehicle; thereby, the cumulative operating time data in the first clocking device 104, the second clocking device 112, the first memory (device) 103 and the second memory (device) 111 are reset accurately to zero; FIG. 3 shows the procedures as to the 0-reset.

A series of procedures start with the step S30 in FIG. 3; subsequently, in the step S31, the 0-reset order for resetting the clocking devices and memories is issued from the external service tool 18 toward the control device 110 in the control unit 11; thereby, at first in the following step S32, the control device 110 resets the data in the second memory (device) 111 and the second clocking device 112 to zero; and, the control device 110 sets a 0-reset prohibition flag on the non-volatile memory in the second memory (device) 111 of the control unit 11 so that a 0-reset cannot be performed again. In the following step S33, the control unit 11 transmits a 0-reset order to the first memory (device) 103 and the first clocking device 104 in the display unit.

In the following step S34, the display control device 101 in the display unit 10 resets the data in the first memory (device) 103 and the first clocking device 104; and, the display control device 101 sets a 0-reset prohibition tin flag on the non-volatile memory in the first memory (device) 103 of the display unit 10 so that a 0-reset cannot be performed again.

Subsequently, in the step S35, the control device 110 of the control unit 11 confirms whether or not the data regarding the cumulative operating time clocked on the control unit side 10 is 0; if not 0 (if the confirmation result is negative), then the step 35 returns back to the entry of the step 33 where the above-described procedures are repeated so that the control unit 10 transmits a 0-reset order to the first memory (device) 103 and the first clocking device 104 via the communication ports 113 and 106;

the display control device 101 in the display unit 10 resets the data in the first memory (device) 103 and the first clocking device 104; and, the display control device 101 sets a 0-reset prohibition flag on the non-volatile memory in the first memory (device) 103 of the display unit 10.

And, when the 0-reset of the first clocking device 104 and the establishment of the 0-reset prohibition flag are completed and confirmed, the step S35 is followed by the step S36 where a series of procedures finishes.

Incidentally, thus far, the explanation has been given in a manner that the 0-reset is performed firstly on the control unit 11 side, and secondly on the display unit 10 side; the sequence is not limited to this example sequence. The reverse sequence may be allowable, namely firstly on the display unit 10 side, and secondly on the control unit 11 side. Further, as a matter of course, the 0-reset may be performed at the same time.

In the manner as described above, even in a case where each of the display unit 10 and the control unit 11 has own clocking device and own memory device, the 0-reset can be surely performed for both clocking devices and memory devices, by the issued 0-reset order. Moreover, in a case where the 0-reset has been already performed for the first clocking device 104 as well as the second clocking device 112, a retrial of 0-reset operation can be rejected thanks to the 0-reset prohibition flags established and stored in the display unit 10 and the control unit 11; thus, the data of the clocking devices (hour meters) can be prevented from being falsified.

INDUSTRIAL APPLICABILITY

In the cargo handling vehicle according to the present invention, the correct cumulative operating time is always conserved even when the clocking device is incorporated in the display unit and has to be replaced by new one in an event of a breakdown; further, the 0-reset of the hour meter fitted to the vehicle can be surely performed at the factory shipment of the vehicle from the factory without incurring a problem (after factory shipment).

The invention claimed is:

1. A method for clocking cumulative operating time for a cargo-handling vehicle provided with a plurality of functional units, the functional units comprising at least a first functional unit and a second functional unit, the first functional unit comprising the first clocking device for clocking the cumulative operating time of the vehicle, the first memory device for storing the cumulative operating time clocked by the first clocking device and, the communication port for communicating with the outside of the first functional unit, the second functional unit comprising the second clocking device for clocking the cumulative operating time of the vehicle, the second memory device for storing the cumulative operating time clocked by the second clocking device, and the communication port for communicating with the outside of the second functional unit; whereby, the first clocking device and the second clocking device clock the cumulative operating time of the vehicle independently of each other so as to configure a duplex system for clocking the cumulative operating time of the vehicle; each of the first and second memory devices storing the cumulative operating time clocked by corresponding clocking device;

the cumulative operating time stored in the first memory device is transmitted toward the second memory device through a communication port in the first functional unit and a communication port in the second functional unit at the time points of predetermined time intervals periodically, whereas the cumulative operating time stored in the second memory device is transmitted toward the first memory device through the communication port in the first functional unit and a communication port in the second functional unit at the time points of predetermined time intervals;

the difference between the cumulative time stored in the first functional unit and the cumulative time stored in the second functional unit is computed in each of the first and second functional units, so that it is grasped whether or not the cumulative operating time stored in one side functional unit is greater than or equal to the cumulative operating time stored in the other side functional unit;

the cumulative operating time stored in the memory device in one side functional unit is renewed with the cumulative operating time stored in the memory device in the other side functional unit in a case where the cumulative operating time stored in the memory device in the one side functional unit is smaller than the cumulative operating time stored in the memory device in the other side functional unit, whereas the cumulative operating time stored in the memory device in one side functional unit is conserved on an as-is basis in a case where the cumulative operating time stored in the memory device in the one side functional unit is greater than or equal to the cumulative operating time stored in the memory device in the other side functional unit.

2. The method for clocking cumulative operating time for a cargo-handling vehicle according to claim 1, whereby, after the data transmission as well as comparison between the data regarding the cumulative operating time in the first and second functional units is executed, the data renewal regarding the cumulative operating time in one of the functional units in a case where the data in the one functional unit is smaller than the data in the other functional unit is performed based on a signal from the key switch that is placed under an ON-state in driving the vehicle.

3. The method for clocking cumulative operating time for a cargo-handling vehicle according to claim 2, whereby the data reception, the data comparison, and the data renewal regarding the cumulative operating time in any one of the functional units are performed by a control device provided in the functional unit, at the time points of predetermined time intervals.

4. The method for clocking cumulative operating time for a cargo-handling vehicle according to claim 2, whereby the memory device in each functional unit comprises a pair of a volatile memory and a non-volatile memory; and, the cumulative operating time clocked by a clocking device in each functional unit is written on the volatile memory; and, the data stored in the volatile memory is written on the corresponding non-volatile memory, at the time points of predetermined time intervals, or in response to a signal from the key switch in stopping the operation of the vehicle.

5. The method for clocking cumulative operating time for a cargo-handling vehicle according to claim 1, whereby the data reception, the data comparison, and the data renewal regarding the cumulative operating time in any one of the functional units are performed by a control device provided in the functional unit, at the time points of predetermined time intervals.

6. The method for clocking cumulative operating time for a cargo-handling vehicle according to claim 5, whereby the memory device in each functional unit comprises a pair of a volatile memory and a non-volatile memory; and, the cumulative operating time clocked by a clocking device in each functional unit is written on the volatile memory; and, the data stored in the volatile memory is written on the corresponding non-volatile memory, at the time points of predetermined time intervals, or in response to a signal from the key switch in stopping the operation of the vehicle.

7. The method for clocking cumulative operating time for a cargo-handling vehicle according to claim 1, whereby the memory device in each functional unit comprises a pair of a volatile memory and a non-volatile memory; and, the cumulative operating time clocked by a clocking device in each functional unit is written on the volatile memory; and, the data stored in the volatile memory is written on the corresponding non-volatile memory, at the time points of predetermined time intervals, or in response to a signal from the key switch in stopping the operation of the vehicle.

8. The method for clocking cumulative operating time for a cargo-handling vehicle according to claim 7, the vehicle further comprising a (communicating) means for communicating with an external service tool, whereby the data regarding the cumulative operating time in the volatile memory is reset to zero according to a 0-reset order from the external service tool; thereby, a 0-reset prohibition flag is set on the memory devices so that the 0-reset is not performed in each of the functional units after the external service tool is detached from the vehicle;

the data in the non-volatile memory is conserved on an as-is basis during the power source is put under an OFF-state or when the 0-reset operation according to the order from the external service tool is completed.

9. A cargo-handling vehicle provided with a plurality of functional units including a first functional unit and a second functional unit, the vehicle having at leas one clocking device and at least one memory device for storing the cumulative operation time of the vehicle clocked by the clocking device, the first functional unit comprising the first clocking device for clocking the cumulative operating time of the vehicle, the first memory device for storing the cumulative operating time clocked by the first clocking device, and the communication port for communicating with the outside of the first functional unit, the second functional unit comprising the second clocking device for clocking the cumulative operating time of the vehicle, the second memory device for storing the cumulative operating time clocked by the second clocking device, and the communication port for communicating with the outside of the second functional unit; whereby, the functional units are controlled so that the first clocking device and the second clocking device clock the cumulative operating time of the vehicle independently of each other so as to configure a duplex system for clocking the cumulative operating time of the vehicle; each of the first and second memory devices storing the cumulative operating time clocked by corresponding clocking device;

the cumulative operating time stored in the first memory device is transmitted toward the second memory device through a communication port in the first functional unit and a communication port in the second functional unit at the time points of predetermined time intervals, whereas the cumulative operating time stored in the second memory device is transmitted toward the first memory device through the communication port in the first functional unit and a communication port in the second functional unit at the time points of predetermined time intervals;

the cumulative time stored in the first functional unit and the cumulative time stored in the second functional unit are compared with each other in each of the first and second functional units, so that it is grasped whether or not the cumulative operating time stored in one side functional unit is greater than or equal to the cumulative operating time stored in the other side functional unit;

the cumulative operating time stored in the memory device in one side functional unit is renewed with the cumulative operating time stored in the memory device in the other side functional unit in a case where the cumulative operating time stored in the memory device in the one side functional unit is smaller than the cumulative operating time stored in the memory device in the other side functional unit, whereas the cumulative operating time stored in the memory device in one side functional unit is conserved on an as-is basis in a case where the cumulative operating time stored in the memory device in the one side functional unit is greater than or equal to the cumulative operating time stored in the memory device in the other side functional unit.

10. The cargo-handling vehicle according to claim 9, the vehicle comprising a control device in any one of the functional units, whereby the control device functions so as to transfer a signal for renewing the data regarding the cumulative operating time from a key switch of the vehicle toward any functional unit other than the functional unit having the control device, in a manner that, after the data transmission as well as comparison between the data regarding the cumulative operating time in the first and second functional units is executed, the data renewal regarding the cumulative operating time in one of the functional units in a case where the data in the one functional unit is smaller than the data in the other functional unit is performed based on the signal from the key switch that is placed under an ON-state in driving the vehicle.

11. The cargo-handling vehicle according to claim 10, whereby the control device is provided in each of the functional units.

12. The cargo-handling vehicle according to claim 10, whereby the memory device in each functional unit comprises a pair of a volatile memory and a non-volatile memory; and, the cumulative operating time clocked by the clocking device in each functional unit is written on the volatile memory and the data written on the volatile memory is written on the corresponding non-volatile memory, at the time points of predetermined time intervals, or at the time point when the power source of the vehicle is put under an OFF-state, according to the control device provided in any one of the functional units.

13. The cargo-handling vehicle according to claim 10, the one of the first and second functional units serving as a control unit and further comprising a communicating means for communicating with an external service tool, whereby the control unit is provided with a function to perform a 0-reset regarding the cumulative operating time of the clocking device and the memory device provided in each of the first and second functional units the control unit resets the data regarding the cumulative operating time in the volatile memory and the non-volatile memory in each of the first and second functional units to zero according to a 0-reset order signal from the external service tool; thereby, the control unit sets a 0-reset prohibition flag on the memory devices so that the 0-reset is not performed in each of the functional units after the external service tool is detached from the vehicle.

14. The cargo-handling vehicle according to claim 9, whereby the control device is provided in each of the functional units.

15. The cargo-handling vehicle according to claim 14, whereby the memory device in each functional unit comprises a pair of a volatile memory and a non-volatile memory; and, the cumulative operating time clocked by the clocking device in each functional unit is written on the volatile memory and the data written on the volatile memory is written on the corresponding non-volatile memory, at the time points of predetermined time intervals, or at the time point when the power source of the vehicle is put under an OFF-state, according to the control device provided in any one of the functional units.

16. The cargo-handling vehicle according to claim 14, the one of the first and second functional units serving as a control unit and further comprising a communicating means for communicating with an external service tool, whereby the control unit is provided with a function to perform a 0-reset regarding the cumulative operating time of the clocking device and the memory device provided in each of the first and second functional units the control unit resets the data regarding the cumulative operating time in the volatile memory and the non-volatile memory in each of the first and second functional units to zero according to a 0-reset order signal from the external service tool; thereby, the control unit sets a 0-reset prohibition flag on the memory devices so that the 0-reset is not performed in each of the functional units after the external service tool is detached from the vehicle.

17. The cargo-handling vehicle according to claim 9, whereby the memory device in each functional unit comprises a pair of a volatile memory and a non-volatile memory; and, the cumulative operating time clocked by the clocking device in each functional unit is written on the volatile memory and the data written on the volatile memory is written on the corresponding non-volatile memory, at the time points of predetermined time intervals, or at the time point when the power source of the vehicle is put under an OFF-state, according to the control device provided in any one of the functional units.

18. The cargo-handling vehicle according to claim 17, the one of the first and second functional units serving as a control unit and further comprising a communicating means for communicating with an external service tool, whereby the control unit is provided with a function to perform a 0-reset regarding the cumulative operating time of the clocking device and the memory device provided in each of the first and second functional units the control unit resets the data regarding the cumulative operating time in the volatile memory and the non-volatile memory in each of the first and second functional units to zero according to a 0-reset order signal from the external service tool; thereby, the control unit sets a 0-reset prohibition flag on the memory devices so that the 0-reset is not performed in each of the functional units after the external service tool is detached from the vehicle.

19. The cargo-handling vehicle according to claim 9, the one of the first and second functional units serving as a control unit and further comprising a communicating means for communicating with an external service tool, whereby the control unit is provided with a function to perform a 0-reset regarding the cumulative operating time of the clocking device and the memory device provided in each of the first and second functional units the control unit resets the data regarding the cumulative operating time in the volatile memory and the non-volatile memory in each of the first and second functional units to zero according to a 0-reset order signal from the external service tool; thereby, the control unit sets a 0-reset prohibition flag on the memory devices so that the 0-reset is not performed in each of the functional units after the external service tool is detached from the vehicle.

* * * * *